(12) United States Patent
Hurwitz et al.

(10) Patent No.: US 10,459,013 B2
(45) Date of Patent: Oct. 29, 2019

(54) APPARATUS FOR AND METHOD OF PROVIDING MEASUREMENTS OF UNCERTAINTY IN RESPECT OF A TRANSFER FUNCTION

(71) Applicant: Analog Devices Global, Hamilton (BM)

(72) Inventors: Jonathan Ephraim David Hurwitz, Edinburgh (GB); Seyed Amir Ali Danesh, Edinburgh (GB); William Michael James Holland, Edinburgh (GB); John Stuart, Norwood, MA (US)

(73) Assignee: Analog Devices Global, Hamilton (BM)

( * ) Notice: Subject to any disclaimer, the term of this patent is extended or adjusted under 35 U.S.C. 154(b) by 151 days.

(21) Appl. No.: 15/185,603

(22) Filed: Jun. 17, 2016

(65) Prior Publication Data

US 2017/0363664 A1 Dec. 21, 2017

(51) Int. Cl.
| | | |
|---|---|---|
| *G01R 19/25* | (2006.01) | |
| *G01R 21/133* | (2006.01) | |
| *G01R 35/00* | (2006.01) | |
| *G01R 27/28* | (2006.01) | |

(52) U.S. Cl.
CPC ........... *G01R 19/25* (2013.01); *G01R 21/133* (2013.01); *G01R 27/28* (2013.01); *G01R 35/00* (2013.01)

(58) Field of Classification Search
CPC .............................. G01R 19/25; G01R 21/133
USPC ......................................................... 702/64
See application file for complete search history.

(56) References Cited

U.S. PATENT DOCUMENTS

| 4,509,132 A | * | 4/1985 | Kavaya | .................... G06G 7/48 |
| | | | | 372/32 |
| 6,232,760 B1 | | 5/2001 | Eckert | |
| 2005/0275395 A1 | | 12/2005 | Yoshihara et al. | |
| 2012/0218004 A1 | * | 8/2012 | Shimizu | ............. G01R 31/2839 |
| | | | | 327/87 |
| 2015/0288277 A1 | * | 10/2015 | Yan | ......................... H02M 3/04 |
| | | | | 323/234 |
| 2016/0154029 A1 | | 6/2016 | Danesh et al. | |
| 2016/0169716 A1 | | 6/2016 | Laflen et al. | |

FOREIGN PATENT DOCUMENTS

| WO | WO-2013038176 A2 | 3/2013 |
| WO | WO-2014072733 A2 | 5/2014 |

OTHER PUBLICATIONS

"International Application Serial No. PCT/US2016/068089, International Search Report dated Apr. 3, 2017", 5 pgs.
"International Application Serial No. PCT/US2016/068089, Written Opinion dated Apr. 3, 2017", 9 pgs.
"International Application Serial No. PCT/US2016/068089, International Preliminary Report on Patentability dated Dec. 17, 2018", 11 pgs.

* cited by examiner

*Primary Examiner* — Ricky Ngon
(74) *Attorney, Agent, or Firm* — Schwegman Lundberg & Woessner, P.A.

(57) ABSTRACT

An apparatus is provided that can estimate a transfer function, for example of current measurement systems, voltage measurement systems and power measurement systems, and also provide an estimate of certainty about the transfer function. This enables customers to have confidence that they are not being overcharged for electricity.

32 Claims, 7 Drawing Sheets

APPARATUS FOR AND METHOD OF PROVIDING MEASUREMENTS OF UNCERTAINTY IN RESPECT OF A TRANSFER FUNCTION

FIELD

The present disclosure relates to an apparatus for estimating a transfer function of a measurement apparatus, and also to providing an estimate of certainty (or uncertainty) relating to the estimate of the transfer function. A method for providing an estimate of certainty in a transfer function is also disclosed. The estimate of certainty (or uncertainty) may be used to control how the estimated transfer function is used or how it is modified or updated.

BACKGROUND

It is often desirable to measure the value of a real world variable. The real world variable may be temperature, pressure, voltage, current flow and the like. In many situations a measurement system provided to measure the real world variable may transform the real world variable into another variable, which is typically an electrical signal. For example, when measuring a voltage where that voltage may be a relatively high voltage, it is often desirable to pass the voltage through a potential divider in order to transform it into a voltage range that is convenient for subsequent processing, for example by an analog to digital converter. Thus, the potential divider has a transfer function, both in terms of its attenuation at direct current DC (0 Hz), and also how the transfer function may vary with frequency. Similarly, if current is to be measured it may be measured by use of a shunt, or a current transformer, amongst other current measuring devices. Again the shunt, transformer or so on has a transfer characteristic such that the input current is transformed to an output value. That output value may then, once again, be processed by subsequent processing circuitry. Other components in the signal path, such as variable gain amplifiers and analog to digital converters also affect the signal, and the whole of the signal processing chain from the sensor to the analog to digital converter can be represented by a combined transfer function.

The provision of a transducer, circuit or other component which exhibits a transfer function means that the output signal is now a function of the unknown input signal, which can be regarded as a "measurand" as it represents a quantity which is to be measured, and the transfer function of the measurement circuit. Thus greater uncertainty has been introduced into the output result.

SUMMARY

According to a first aspect of the present disclosure there is provided a transfer function apparatus for establishing a transfer function of at least one measurement apparatus, where the measurement apparatus estimates a value of a measurand, where a known perturbation is made to the measurand and an output of the measurement apparatus is examined to identify a response to the known perturbation, and where the transfer function apparatus estimates uncertainty in the transfer function of the measurement apparatus.

Preferably the measurand is at least one of a current flow in a conductor and a voltage at a measured node of the conductor. It is therefore possible to provide an estimate of the power being consumed by one of more loads having their power supplied via the conductor together with an estimate of the certainty or uncertainty of the power measurement.

The transfer function may be determined for a whole or part of a signal processing chain. Estimating the transfer function for part of the signal processing chain may be appropriate when other parts of the signal chain have a reliable or known/calibrated transfer function.

Advantageously the transfer function apparatus is included within a watt-hour meter.

According to a second aspect of the present disclosure there is provided a method of providing a confidence value in a measurand where the measurand is processed by a measurement arrangement having a transfer function, the method comprising providing an estimate of a confidence value for the measurand.

Advantageously the confidence value is based on an estimate of certainty of the transfer function.

BRIEF DESCRIPTION OF THE DRAWINGS

Embodiments of the present disclosure will now be described, by way of non-limiting example only, with reference to the accompanying Figures, in which.

DESCRIPTION OF SOME EMBODIMENTS OF THE PRESENT DISCLOSURE

Figure 1:
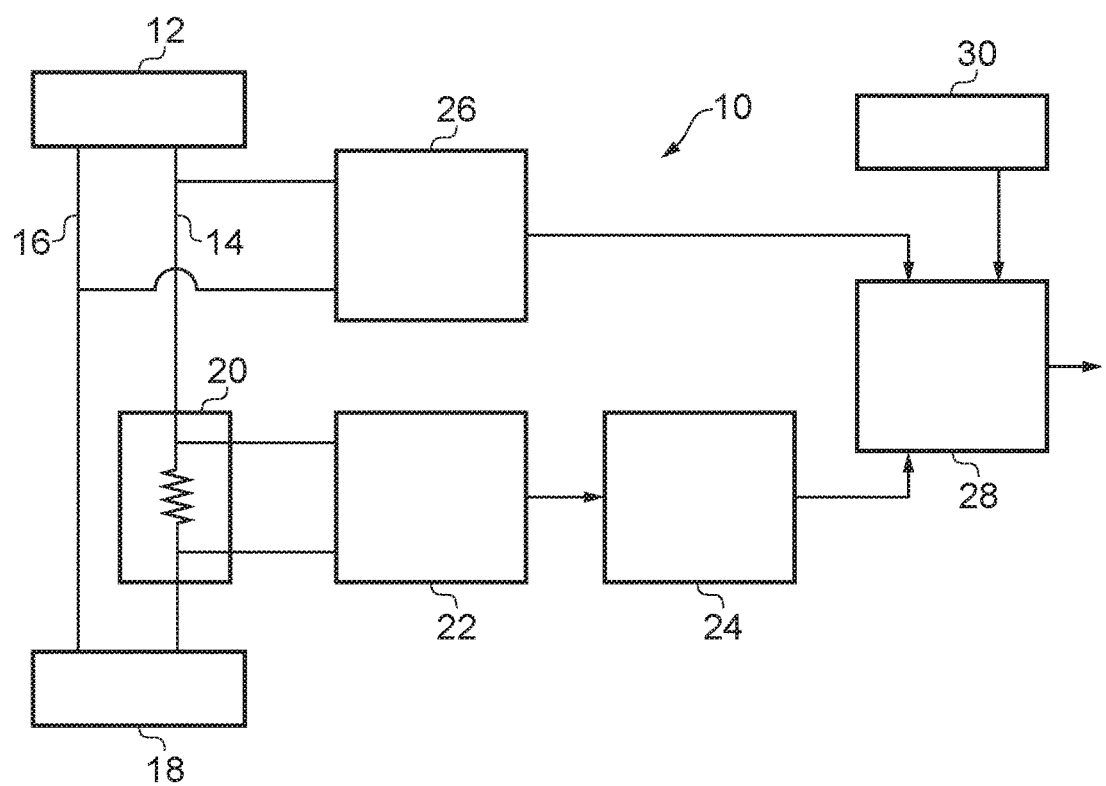
FIG. 1 schematically illustrates the components within an electronic watt-hour power meter.

FIG. 1 schematically illustrates a power measurement apparatus 10 which may form part of an electricity consumption meter, also known as a watt-hour meter, installed at a point of electrical supply, for example to residential or business premises. In this example a single phase mains alternating current electricity supply 12 having a live conductor 14 and neutral conductor 16 supplies a load 18. As is known to the person skilled in the art, the amount of power consumed by the load depends on the voltage between the live and neutral conductors 14 and 16, the current drawn by the load, and a phase angle between the alternating voltage waveform and the alternating current waveform for a sinusoidal voltage current. For more complex waveforms where for example there are significant amounts of harmonic components present in the amount of current drawn, the power consumption should be measured by keeping a running sum of the instantaneous power consumed.

In order to measure the current the power measurement apparatus 10, in this example, has a shunt resistor 20 of nominally known resistance in the conductive path represented by the live supply wire between the load 18 and the electricity supply 12. Typically the shunt resistance is of a very low value, typically in the order of a milli-ohm or so. The voltage dropped across the shunt resistor 20 is proportional to the current passing through it. As a result, the shunt resistance can be regarded as having a current to voltage transfer function. Consequently an estimate of the current in the conductor 14 can be reliably made by a voltage measurement apparatus 22 arranged to measure the voltage across the shunt resistor 20 and to provide its output to a signal processing circuit 24, provided that the resistance of resistor 20 is well known, or more accurately, providing that the transfer function of the items 20 and 22 are well known. The measurement apparatus 22 may include programmable gain amplifiers to change a gain applied to the current signal to allow an analog to digital converter with a modest dynamic range cope with a range of currents from very small to very large without losing resolution, at least in respect of smaller current flows.

Additionally, a voltage measurement apparatus 26 is provided to measure the voltage difference between the live conductor 14 and the neutral conductor 16. In a domestic environment that voltage would generally be in the range of 115 to 250 volts RMS, and hence may experience peak voltages in excess of 300 volts. Consequently the voltage measurement apparatus 26 often includes a potential divider, as will be discussed in more detail with respect to FIG. 2, in order to transform the input voltage from the mains voltage domain to a smaller voltage domain more suitable for signal acquisition by, for example, an analog to digital converter within the voltage measurement apparatus 26. The voltage measurement apparatus may include programmable voltage attenuators and/or programmable amplifiers such that a single design of measurement circuit can be used in installations or countries having different supply voltages. The instantaneous measurements of voltage and current from the voltage measurement apparatus 26 and the current measurement apparatus 20, 22, 24 may be provided to a computational unit 28 adapted to calculate the root mean square power taken by the load 18 from the supply 12, and optionally to multiply that by a tariff such that the consumer who operates load 18 may be appropriately charged for the amount of power that they have received from the electricity source 12. The computational unit 28 may be associated with a real time clock 30 such that each voltage and current measurement is properly allocated in the time domain for a true and appropriate calculation of power consumption.

Figure 2:
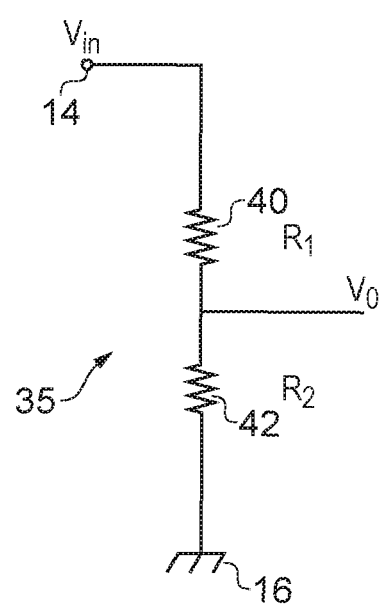
FIG. 2 schematically illustrates a potential divider to consider how its transfer function may not be well known.

FIG. 2 schematically illustrates a resistor for potential divider 35 receiving an input voltage Vin from conductor 14 and dividing it down with reference to the neutral voltage provided at conductor 16. In this example first and second resistors 40 and 42 are connected in series between the conductors 14 and 16. The same current flows through each resistor and hence the output voltage Vo can be related to the input voltage Vin by $$Vo=VinR2/R1+R2$$

where R1 is a value of the resistor 40 and R2 is the value of the resistor 42. Thus the potential divider has a transfer function set by the relative values of resistors R1 and R2. In order to accurately know the voltage one must accurately know the transfer function of the potential divider.

Ways of determining the transfer functions are known in the prior art and have been described in WO2014/072733 and WO2013/038176 to which the reader is referred for enabling disclosures as to how to estimate the voltage and current transfer functions. However, for ease of reference, examples of those patent applications are included herein.

Figure 3:
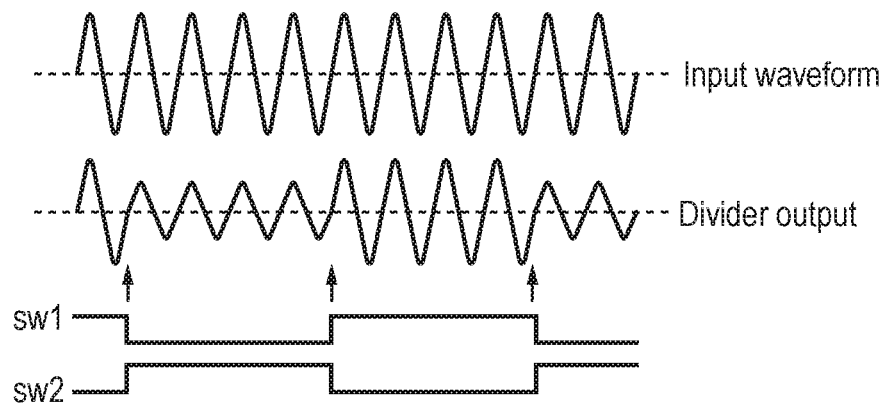
FIG. 3 schematically illustrates one embodiment of an apparatus, as described in WO2014/072773 for overcoming the problem with the unknown transfer function.
Figure 3:
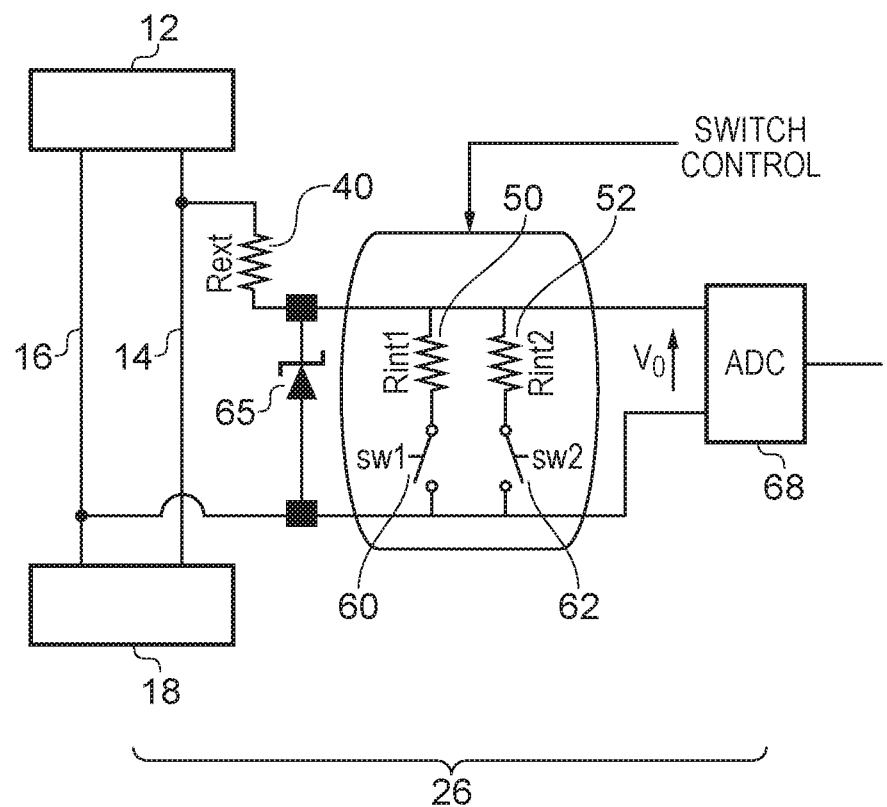

In WO2014/072733 the transfer function for the voltage measurement circuit can be determined by several approaches. One approach as shown in FIG. 3, is to provide two resistors 50 and 52 having accurately known values ($R_{int}1$ and $R_{int}2$) such that either may form a potential divider with an external resistance, $R_{ext}$, which represents the first resistor 40 in FIG. 2. By forming successive potential dividers between resistor 40 and resistor 50, and then resistor 40 and resistor 52 under the control of series connected switches 60 and 62 different divide ratios are formed, and provided that the value of resistors 50 and 52 are well known, then the transfer function of the potential divider can be determined. The switches 60 and 62 are driven in antiphase during calibration, whereas in normal use one switch, for example SW1 is left on whereas the other is off so as to keep the divide ratio of the potential divider nominally constant.

A protection device, such as a Zener diode 65 may be provided to limit the maximum voltage (both forward and reverse) that can occur across the resistors 50 and 52, for example due to a failure of one of the switches 60 and 62, although these are likely to be implemented as field effect transistors. The output voltage $V_O$ is measured by an ADC 68.

Figure 4:
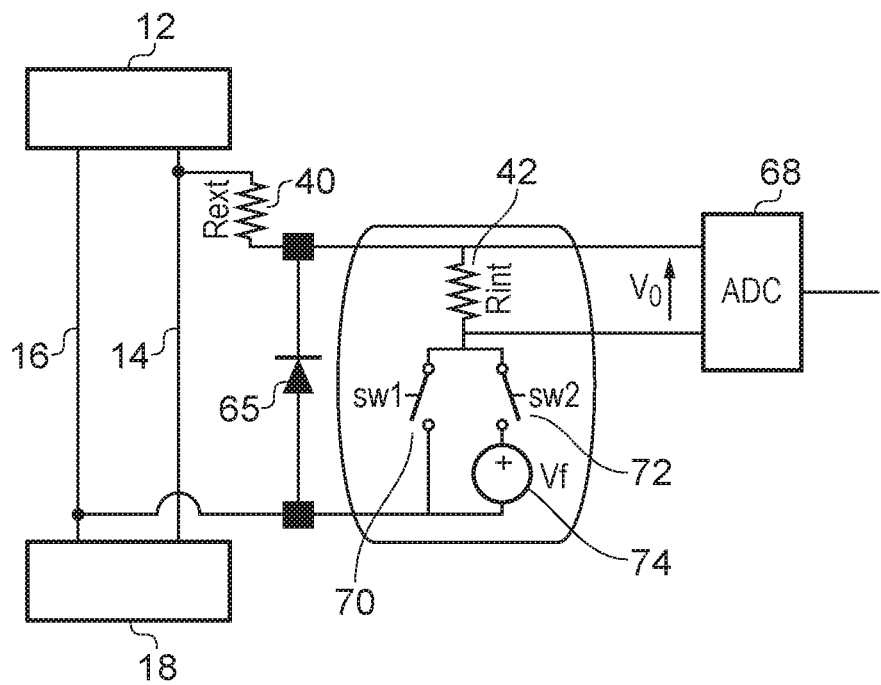
FIG. 4 schematically represents a second apparatus and waveform as disclosed in WO2014/072733 for measuring voltage.
Figure 5:
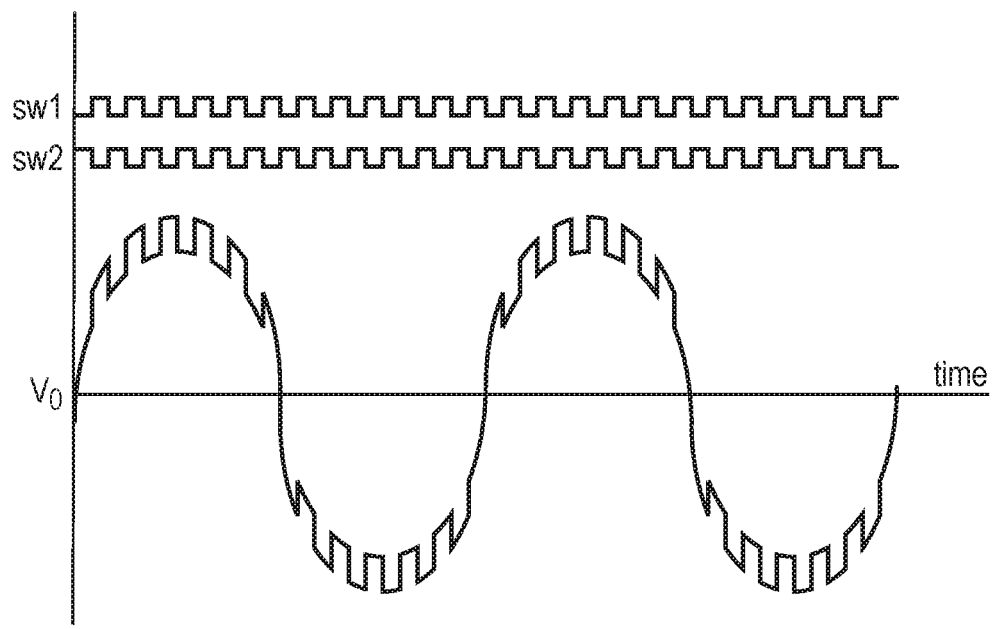
FIG. 5 schematically illustrates the output signal $V_O$ from the apparatus of FIG. 4.

Another approach as shown in FIG. 4 is to sequentially modify a voltage across a potential divider. It is most conveniently performed by modifying the voltage acting between R2 and the local ground. Such an arrangement is shown in FIG. 4 where the resistors 40 and 42 are again provided in series to create a potential divider. However the end of resistor 42 not connected to the resistor 40 can sequentially be connected to the ground, either directly by way of a first switch 70, or to ground by way of a voltage source 74 in series with a second switch 72. Thus, as shown in FIG. 5 by sequentially switching switches S1 and S2 the voltage at the output of the potential divider is modulated. Given that the value of the voltage 74 is known to within a predetermined level of certainty (as specified by the designer), then provided the value of the second resistor 42 is known then the transfer function of the voltage divider can be determined. Furthermore, it follows that if the voltage 74 can provide two or more controllable output voltages, then the transfer function of the potential divider formed by resistors 40 and 42 can be determined without knowing the value of either resistor 40 or 42. The output voltage Vo is then provided to an analogue to digital convertor 68 for conversion into the digital domain before being provided to subsequent circuits, such as a digital filter 24. The voltage source and switches may be associated with, for example, an operational amplifier forming the ground voltage for resistor 42.

The techniques described here, or the other ones disclosed in WO2014/072733 can be used interchangeably in the practice of the present disclosure and are appropriate to either single phase or multiphase systems.

Similarly, as noted with respect to FIG. 1, the transfer function of the current measuring circuit also needs to be known.

Figure 6:
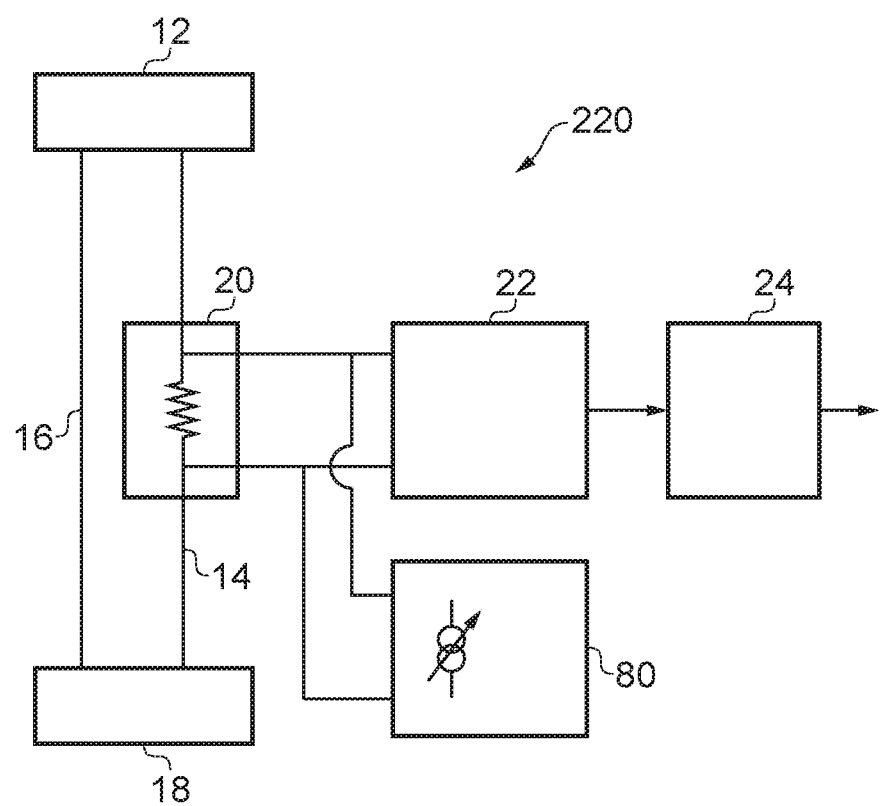
FIG. 6 schematically illustrates a current measurement apparatus as described in WO2013/038176.

A suitable arrangement is shown in FIG. 6. Here the shunt resistor 20 is, as shown before with respect to FIG. 1, connected in the current flow path of the live conductor between the source 12 and the load 18. The voltage across the shunt resistor 20 is measured by a voltage measuring circuit 22, for example in the form of an analog to digital convertor. In order to determine the transfer function of the current measurement path a current measurement circuit 80 is provided which comprises a controllable current source/current sink which can controllably pass an additional current through the resistor 20. The resistance of the resistor 20 is very low, and hence is susceptible to change as a result of impurities at its contacts, hence the value may be quite uncertain. That additional current, which value is well known and controlled, gives rise to a corresponding voltage change across the resistor 20 which can be measured by the analog to digital convertor 22 and then this information can be used to determine the transfer function of the current measurement path. In the arrangement shown in FIG. 6 the circuit 80 injects current at one end of the resistor and removes it at the other. Thus, in this arrangement, the current flow may be bidirectional. However, in other arrangements the connection might only be made to the load end of the resistor 20, such that current is drawn through the resistor.

A controllable current source 80 may for example be operated in a substantially binary manner such that it is either on or off. However, as contemplated in WO2013/038176 the current source may also be modulated to a plurality of current values for greater resolution, see for example FIG. 17c thereof.

Thus the transfer functions in the voltage measurement domain and the current measurement domain can be estimated, or at least sufficient data to estimate those transfer functions whilst the watt-hour meter is in use can be obtained.

In use the perturbations applied in the voltage measurement circuit and in the current measurement arrangement are generally provided at a known frequency, and at a frequency which is selected on the assumption that it is not a harmonic of the fundamental supply or load frequency. However the performance of the load 18 is not known and it may be electrically noisy. For example the load might be a large computer load having a switch mode power supply which may be noisy, may include fluorescent lighting, or may be an ensemble of devices connected to the load. As a result the frequency spectrum of the current waveforms, and indeed the voltage waveform due to noise propagating back up the conductors towards the power source, may interfere with the determination of the transfer functions. Indeed, the harmonics from the load represent noise at the perturbation frequency which may cause the estimate of the transfer function to become variable.

The variation in successive estimates of the transfer function and/or noise compared to the perturbation signal can be used to determine a level of confidence, or conversely at a level of uncertainty, in the transfer function and hence in the current, voltage or power measurements made using the apparatus. The uncertainty may be determined by looking at the variation in a predetermined number of transfer function estimates, and then by analyzing the scatter between those values, using statistical tools such as T-tests or standard deviations to provide an estimate of confidence or uncertainty. Furthermore, the measurements of confidence or uncertainty (one likely be the obverse of the other) can be used to determine when the perturbation frequencies are inappropriate, for example because they are being interfered with, and can invoke a change, which may be a predetermined change or which may be as a result of searching though the frequency spectrum in order to find a relatively quiet place, for the perturbation frequency.

In some embodiments a weighting may be applied to reduce the influence of spurious results. Thus a difference between a measurement value and a group or average value of an input signal, or of the estimate of the transfer function, as appropriate, may be used to weight the measurement value, with larger differences being given less weight in subsequent calculations. Subsequent calculations may include updating the estimate of the transfer function or modifying the measurement apparatus, for example by adjusting an amplifier gain in the signal path or by adjusting a scaling factor that is applied after the analog to digital conversion. The gain change or scaling factor change can be used to set the response of the system to the perturbation signal to a predetermined value, thereby ensuring that the current and/or voltage measurements remain sufficiently accurate for purpose.

The threshold for changing perturbation frequency may be fixed, or it may be dynamic based on previous estimates of certainty or uncertainty.

Outputting the measures of confidence is advantageous for network operators as it may enable diagnostic operations to be performed. For example, if the measures of confidence from one or more power meter units show a systematic variation with time, for example such that at certain times of the day the confidence is high, but at other times of the day the confidence is low, then the power supply operator may deduce that a noisy load is being used. It might prompt further investigation as to whether the load is an acceptable load for connection onto the network. Furthermore the measures of confidence may also be used when assessing consumers' bills, the measures of confidence being correlated with the corresponding power measurements in order to ensure that the power supply operator or provider does not contravene regulatory requirements concerning not overcharging a consumer.

Outputting the measures of confidence along with the measurement of transfer function can allow a decision to be made as to whether to apply the transfer function for a purpose of changing the operation of the measurement system or to adjust a scaling or correction factor. For example when the confidence has exceeded a certain value, the measurement of transfer function could be deemed sufficiently accurate to be used to store as the calibration value, or to be applied directly as part of a real-time tracking algorithm for dynamic compensation of the transfer function. Thus if a transfer function seems wrong, for example because the size of the current perturbation signal as extracted during the signal processing is repeatedly, say, 99.3% of the expected value and the estimate of uncertainty associated with the signal is around 0.1%, then the apparatus may update the scaling factor to be 100/99.3=1.007 such that the measurements of current remain accurate.

Figure 7:
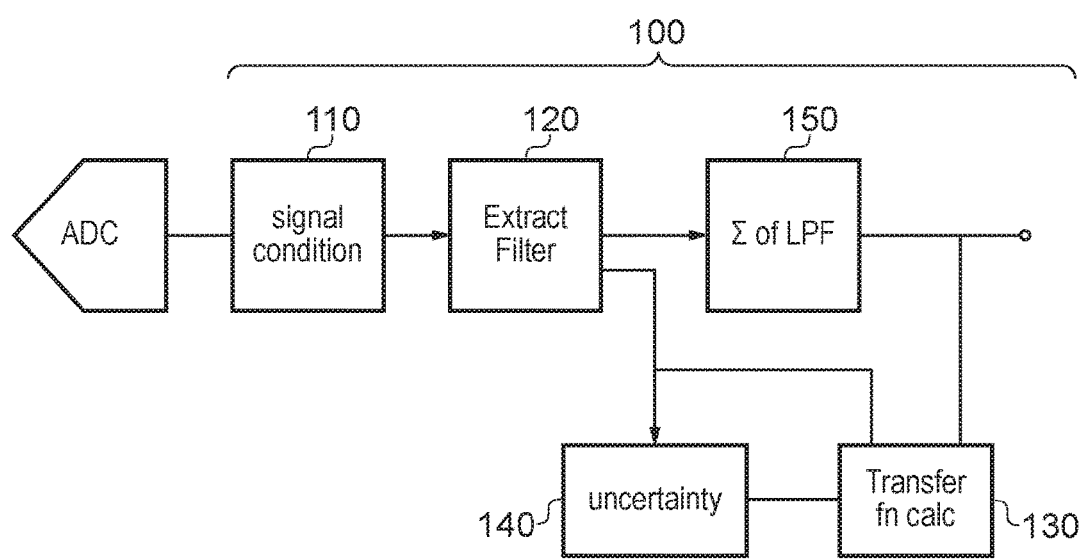
FIG. 7 shows a block diagram of components in a channel of a transfer apparatus.

FIG. 7 schematically illustrates the functional blocks within a transfer function measuring apparatus, generally designated 100, and constituting an embodiment of this disclosure. The apparatus 100 is responsive to the output of an ADC such as the ADC 68 which may be included in block 26 of FIG. 1, or the ADC associated with the current measurement channel as represented by block 22 of FIG. 1. The output of the ADC may require signal conditioning, for example scaling, windowing or equalizing in order to accommodate for variations in ADC performance, and/or align data for use in subsequent processing, especially where the data may be collected amongst several channels each similar or identical to that shown in FIG. 7, as might be the case in a multiphase system. The signal conditioning can be performed in the digital domain by block 110. The conditioning signal from block 110 may then be provided to an extraction circuit 120 which serves to extract the perturbation signal provided by the measurement apparatus. In this context, extraction could be regarded as synonymous with band pass filtering the input signal around the perturbation signal in order to provide a measurement of the perturbation signal to a transfer function calculator 130 and an uncertainty calculator 140. The uncertainty calculator may work directly with the perturbation signal from the extractor 120 if the transfer function can be assumed or it may additionally or alternatively work with the output from the transfer function calculator.

The uncertainty estimator may determine the value or magnitude of changes in the perturbation signal and/or the relative power of the perturbation signal to other signals as a way of estimating a lower limit of uncertainty in the estimate of uncertainty. Furthermore a lower limit due to component tolerances or ADC resolution may be programmed in the uncertainty estimator The filtered signal from block 120 may also be provided to an accumulator 150 which may act like a low pass filter, for example serving to sum a series of instantaneous voltage or current measurements into an aggregate value over a larger time period, thereby reducing the computational load of downstream processes.

Although only one channel has been shown in FIG. 7, a similar channel may be provided such that a power meter can measure the voltage and current prevailing in a single phase of the supply. Additional channels can be provided for each additional measurement that is required in respect of the or each other phase of the supply.

Figure 8:
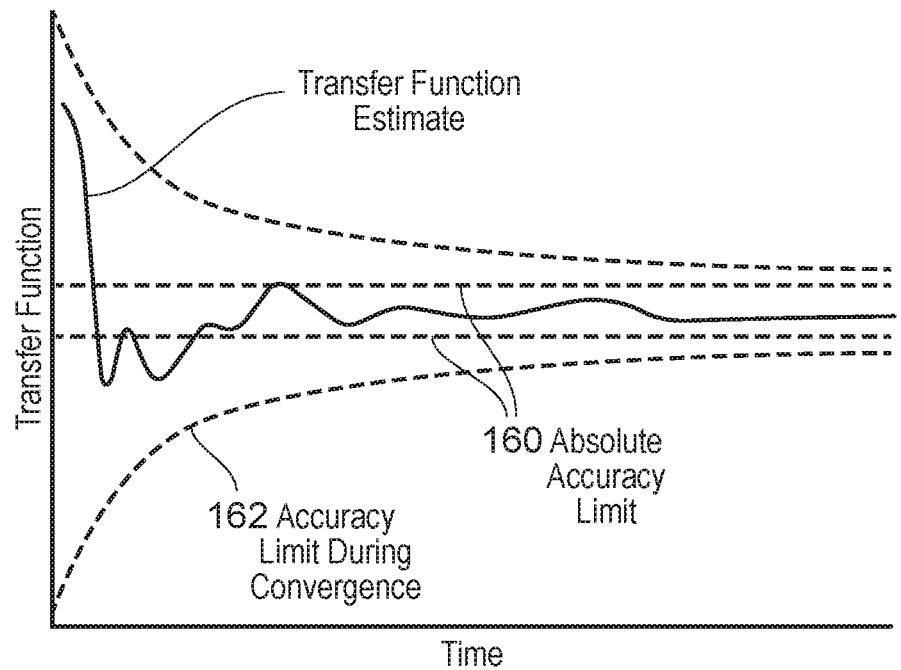
FIG. 8 shows the evolution of the estimate of transfer function with respect to time.
Figure 9:
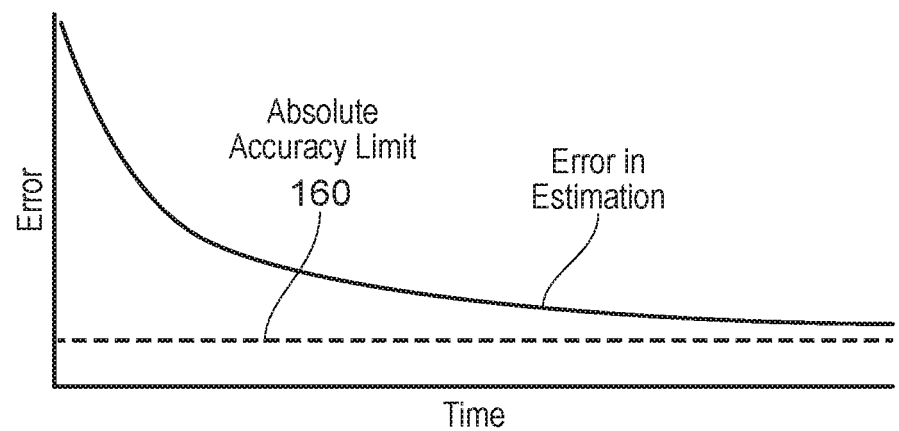
FIG. 9 shows the evolution of uncertainty in the transfer function with respect to time.

In operation, when the transfer measuring apparatus is switched on it takes a little while to correctly estimate both the transfer function and the error in the transfer function. The evolution of the transfer function estimate with respect to time is shown in FIG. 8. The transfer function estimate for a given run is shown in a solid line, whereas the chain lines denote two accuracy limits. The horizontal chain lines 160 in FIG. 8, and again in FIG. 9, represents the absolute accuracy limit for the measurement apparatus. This is determined by the accuracy limits of the signal source through manufacturing, test and use, i.e. the uncertainty in the size of the excitation signal. For example the uncertainty may be due to the finite resolution of the test equipment that measures the source, or due to the change in value due to stress when the component is reflowed, or due to the change in the source due to temperature and an unknown temperature coefficient. This error is defined in a given system. Another limit 162 is the accuracy limit during convergence from a finite signal to noise ratio, for example within any amplifier and the ADC within the analog processing chain The uncertainty due to the presence of noise starts off larger but asymptotes towards the absolute accuracy limit and eventually beyond if the noise is uncorrelated and the method of calculation of the transfer function not truncated (e.g. through a leaky integrator of finite length). If another run was made under the same noise conditions it would have a different response, but be within the limits set by the convergence limit 162.

FIG. 9 shows the evolution of total error, a combination of convergence error and absolute error, with respect to time, and here, once again, the error in the transfer function, which represents the uncertainty, can start with a relatively large value but decreases in time, again at asymptoting towards the absolute accuracy limit.

The estimate of the transfer function can be updated based on a difference between a preceding estimate of the transfer function, which can be a composite value formed as a running sum of weighted estimates, and a new estimate of the value of the transfer function. The difference can be weighted according to the estimate of uncertainty and then added to the composite value to create a new composite value.

If the estimate of uncertainty is too large, the update process may be inhibited, or modified to converge more slowly or to use a default value as an initial value. As an alternative the step size applied to the estimate of the transfer function can be set to predetermined values, i.e. to increase or to decrease a parameter of the transfer function by a predetermined value, where the size of the value may be a function of the estimate of uncertainty and the number of updates which have been applied. As noted before an alternative approach, the estimate of the transfer function of the signal processing chain may be kept unaltered (for example at its "as manufactured" value and a correction factor can be periodically updated with the estimate of uncertainty be used as a controlling factor in deciding whether the correction factor is to be allowed to update or not, and how much weight should be given to recent measurements.

Furthermore the value of the estimate of uncertainty may be used to cause a change in the frequency of the perturbation signal and/or a change in the magnitude of the perturbation signal in order to improve the observability of the perturbation signal.

The apparatus described herein can be implemented solely within the digital domain, either by dedicated hardware or by suitable code running in conjunction with a processor unit. A processor need not run that fast, and clock speeds will be few tens of MHz are more than adequate for performing the computational tasks required in real time. In testing the inventors have built and run power measurement systems with an accuracy of 0.2%. From a cold start, the system has estimated the transfer function to within 0.5% after 30 seconds, and improving to 0.25% accuracy within 128 seconds. In this context, "cold start" means that the system has not kept any knowledge of previous estimates of the transfer function of the potential divider or the current measurement transducer.

If the system has a record of previous estimates, then a sudden change in the transfer function or the estimate of uncertainty or the correction factor may be indicative of a fault condition (which could include malicious attempts to defeat the measurement apparatus) which can be flagged for attention. Data can be stored or transmitted for analysis which may examine the evolution of the transfer function, uncertainty value or correction factor over time to look for faults, tampering or other events that have perturbed the operation of the power meter.

It is thus possible to provide a system for estimating the goodness or confidence of a transfer function, and to a measurement apparatus, for example a voltage measurement arrangement, a current measurement arrangement and/or a power measurement arrangement where a value of the measurand and an estimate of confidence in that value can be output.

The claims presented here are in single dependency format suitable for filing at the US PTO, but it should be considered that each claim can depend on any other preceding claim of the same type, except where that is clearly unfeasible.

The invention claimed is:

1. A transfer function measurement circuit for estimating a transfer function of an electronic system, the transfer function measurement circuit comprising:

a measurement circuit coupled to a sensor, wherein the transfer function measurement circuit estimates a value of a measurand or a correction factor associated with the electronic system, the transfer function measurement circuit being configured to:
provide a perturbation signal to the sensor using the measurement circuit,
measure a resulting signal through the sensor;
estimate, at different first and second points in time, respective first and second transfer functions of the electronic system based on the perturbation signal and the resulting signal;
compute a difference between the first and second transfer functions;
determine a level of confidence or uncertainty in at least one of the first and second transfer functions; and
perform an action associated with the electronic system based on the difference and the level of confidence or uncertainty, the action comprising at least one of adjusting operation of the electronic system or flagging a fault condition for attention.

2. A transfer function measurement circuit as claimed in claim 1 in which the difference is computed by calculating a standard deviation of the estimates of the transfer functions.

3. A transfer function measurement circuit as claimed in claim 1 in which the transfer function measurement circuit is further configured to update the first or second transfer functions based on the difference between the first or second transfer functions and a composite value formed as a running sum of weighted estimates of the first and second transfer functions, wherein the difference is weighted according to the level of confidence or uncertainty and then added to the composite value to create a new composite value.

4. A transfer function measurement circuit as claimed in claim 1 in which the level of confidence or uncertainty is used to modify the perturbation signal or to initiate a change in the perturbation signal when the level of confidence or uncertainty changes at a rate greater than a predetermined rate or exceeds a threshold.

5. A transfer function measurement circuit as claimed in claim 4 in which the threshold is a dynamic threshold based on previous estimates of the level of confidence or uncertainty.

6. A transfer function measurement circuit as claimed in claim 4 in which the threshold is a predetermined threshold.

7. A transfer function measurement circuit as claimed in claim 4 in which the change in the perturbation signal comprises changing at least one of a frequency and a magnitude of the perturbation signal.

8. A transfer function measurement circuit as claimed in claim 7 in which the frequency of the perturbation signal is changed to a frequency with reduced noise or harmonic energy.

9. A transfer function measurement circuit as claimed in claim 1, in which the transfer functions are analyzed by a processor to perform at least one of calibration checking, fault diagnosis and tamper detection.

10. A transfer function measurement circuit as claimed in claim 1, in which the transfer functions are transmitted to a remote entity for analysis to perform at least one of calibration checking, fault diagnosis and tamper detection.

11. A transfer function measurement circuit as claimed in claim 1, in which the level of confidence or uncertainty is used to control at least one of: a modification or update of the transfer functions; the uses that the transfer functions can be validly used for; a modification or update of the correction factor, and whether the estimate of the transfer functions is replaced by a default value.

12. A transfer function measurement circuit as claimed in claim 11 in which updating of the transfer functions or the correction factor is inhibited if the level of confidence or uncertainty exceeds a threshold value.

13. A transfer function measurement circuit as claimed in claim 1 further comprising an extraction circuit that provides a measurement of the perturbation signal, the extraction circuit comprising a band pass filter that filters around a frequency of the perturbation signal.

14. A transfer function measurement apparatus as claimed in claim 1 wherein the transfer function measurement circuit is further configured to determine at least one of a magnitude of changes in the perturbation signal and a relative power of the perturbation signal to other signals to estimate a lower limit of uncertainty in the level of confidence or uncertainty.

15. The transfer function measurement circuit of claim 1, wherein the first transfer function is determined when the electronic measurement system is manufactured.

16. The transfer function measurement circuit of claim 1, wherein the first and second functions are computed during use of the electronic measurement system.

17. The transfer function measurement circuit of claim 1, wherein the at least one of the first or second transfer function estimates is performed based on a plurality of transfer function estimations, and wherein the confidence or uncertainty is further determined based on the plurality of transfer function estimations.

18. The transfer function measurement circuit of claim 1, wherein the electronic system is a power meter, wherein the sensor is a resistor, and wherein the perturbation signal is provided to the resistor using a current measurement circuit.

19. The transfer function measurement circuit of claim 18, wherein the resulting signal is measured using a voltage measurement circuit.

20. A method of estimating a transfer function of an electronic system, the method comprising:
estimating, using a transfer function measurement circuit comprising a measurement circuit coupled to a sensor, a value of a measurand or a correction factor associated with the electronic system;
providing a perturbation signal to the sensor using the measurement circuit;
measuring a resulting signal through the sensor using the measurement circuit;
estimating, at different first and second points in time, respective first and second transfer functions of the electronic system based on the perturbation signal and the resulting signal;
computing a difference between the first and second transfer functions;
determining a level of confidence or uncertainty in at least one of the first and second transfer functions; and
performing an action associated with the electronic system based on the difference and the level of confidence or uncertainty, the action comprising at least one of adjusting operation of the electronic system or flagging a fault condition for attention.

21. A method as claimed in claim 20, in which computing the difference comprises using one of a standard deviation and a t-test of the estimates of the transfer functions to estimate the certainty of the estimated transfer functions.

22. A method as claimed in claim 20, further comprising changing a parameter of the perturbation signal if the confidence value is not within an acceptable range of values.

23. A method as claimed in claim 22, in which the parameter of the perturbation signal is at least one of a frequency of the perturbation signal and an amplitude of the perturbation signal.

24. A method as claimed in claim 20 in which the confidence value is used for at least one of the following: controlling an update of the transfer functions; and controlling or modifying a process for estimating certainty of the transfer functions.

25. The method of claim 20, wherein the electronic system is a power meter, wherein the sensor is a resistor, and wherein the perturbation signal is provided to the resistor using a current measurement circuit.

26. The method of claim 25, wherein the resulting signal is measured using a voltage measurement circuit.

27. A transfer function measurement circuit for estimating a transfer function of an electronic measurement system, the transfer function measurement circuit comprising:
a measurement circuit coupled to a sensor, wherein the transfer function measurement circuit estimates a value of a measurand or a correction factor associated with the electronic measurement system, the transfer function measurement circuit being configured to:
provide a perturbation signal to the sensor using the measurement circuit;
measure a resulting signal through the sensor;
estimate at least three transfer functions of the electronic measurement system based on the perturbation signal and the resulting signal;
compute an average based on the at least three transfer functions;
determine a level of confidence or uncertainty based on the at least three transfer functions; and
perform an action associated with the electronic measurement system based on the average and the level of confidence or uncertainty, the action comprising changing operation of the electronic measurement system or flagging a fault condition.

28. The transfer function measurement circuit of claim 27, wherein the action is based on a comparison of the average with another measurement of a transfer function and the determined level of confidence of uncertainty.

29. The transfer function measurement circuit of claim 27, wherein the action includes storing an initial value for subsequent use by the electronic measurement system.

30. The transfer function measurement circuit of claim 27, wherein the level of confidence or uncertainty is based on a standard deviation.

31. The transfer function measurement circuit of claim 27, wherein the electronic measurement system is a power meter, wherein the sensor is a resistor, and wherein the perturbation signal is provided to the resistor using a current measurement circuit.

32. The transfer function measurement circuit of claim 31, wherein the resulting signal is measured using a voltage measurement circuit.

* * * * *